United States Patent
Chang et al.

(10) Patent No.: US 11,004,486 B2
(45) Date of Patent: May 11, 2021

(54) DRIVING CIRCUIT

(71) Applicant: Realtek Semiconductor Corporation, Hsinchu (TW)

(72) Inventors: Chia-Ling Chang, Hsinchu (TW); Wei-Cheng Tang, Zhubei (TW); Li-Lung Kao, New Taipei (TW); Che-Hung Lin, Chiayi County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 21 days.

(21) Appl. No.: 16/512,776

(22) Filed: Jul. 16, 2019

(65) Prior Publication Data

US 2020/0135244 A1    Apr. 30, 2020

(30) Foreign Application Priority Data

Oct. 26, 2018 (TW) ................. 107138056

(51) Int. Cl.
*H03K 5/04* (2006.01)
*G11C 7/10* (2006.01)

(52) U.S. Cl.
CPC .......... *G11C 7/1051* (2013.01); *G11C 7/1078* (2013.01)

(58) Field of Classification Search
CPC ............... H03K 5/04; H03K 5/1534; H03K 19/017509; H03K 19/018521
See application file for complete search history.

(56) References Cited

U.S. PATENT DOCUMENTS

| 8,004,887 B2 | 8/2011 | Roohparvar et al. |
| 9,007,503 B2 | 4/2015 | Oike |
| 2018/0241378 A1 | 8/2018 | Kowkutla et al. |

OTHER PUBLICATIONS

Behzad Razavi, The Bootstrapped Switch, IEEE Solid-State Circuits Magazine, A Circuit for All Seasons, 2015.

*Primary Examiner* — Patrick O Neill
(74) *Attorney, Agent, or Firm* — Locke Lord LLP; Tim Tingkang Xia, Esq.

(57) ABSTRACT

The present disclosure relates to a driving circuit including a first circuit, a transistor switch, and a voltage level conversion circuit. The first circuit includes an operational amplifier and a feedback circuit, and is configured to output a first signal (e.g., an analog signal). The feedback circuit is configured to feed back the first signal to the operational amplifier. A source terminal and a drain terminal of the transistor switch are respectively electrically coupled to the operational amplifier and an output pin of the driving circuit. The voltage level conversion circuit is connected to the source terminal and a gate terminal of the transistor switch. When the voltage level conversion circuit is enabled, a voltage difference between the gate terminal and the source terminal of the transistor switch is controlled to a set value, so that the first signal is output to the output pin through the transistor switch.

10 Claims, 6 Drawing Sheets

DRIVING CIRCUIT

CROSS-REFERENCE TO RELATED APPLICATION

This application claims priority to Taiwan Application Serial Number 107138056, filed Oct. 26, 2018, which is herein incorporated by reference in its entirety.

BACKGROUND

Technical Field

The present disclosure relates to a driving circuit, which is configured to output signal to an output pin through a transistor switch.

Description of Related Art

In the circuit design, the switching element is often used to control the conduction of the circuit to output the corresponding signal at the correct time. With the increasing complexity of circuit design and the market demand for miniaturization of electronic devices, the relationship between different circuits in electronic devices is becoming more and more close. Therefore, as a bridge for signal transmission, the switching element directly affects the operation of the electronic device, and becomes an important subject that must be paid attention in the circuit design.

SUMMARY

One aspect of the present disclosure is a driving circuit, comprising a first analog circuit, a digital circuit and a first voltage level conversion circuit. An output terminal of the first analog circuit is configured to output a first analog signal. The digital circuit is configured to output a digital signal. The first transistor switch comprises a source terminal, a gate terminal, and a drain terminal. The source terminal of the first transistor switch is electrically coupled to the output terminal of the first analog circuit. The drain terminal of the first transistor switch is electrically coupled to an output pin of the driving circuit. The first voltage level conversion circuit is electrically coupled between the source terminal of the first transistor switch and the gate terminal of the first transistor switch. When the first voltage level conversion circuit is enabled, the first voltage level conversion circuit is configured to control a voltage difference between the gate terminal and the source terminal of the first transistor switch to a set value, so that the first transistor switch is turned on, and the first analog signal is outputted to the output pin of the driving circuit through the first transistor switch. When the first voltage level conversion circuit is disabled, the first transistor switch is turned off, so that the digital signal is outputted to the output pin of the driving circuit.

Another aspect of the present disclosure is a driving circuit, comprising a first circuit, a transistor and a voltage level conversion circuit. The first circuit comprises an operational amplifier and a feedback circuit. An output terminal of the operational amplifier is configured to output a first signal. The feedback circuit is electrically coupled between an input terminal of the operational amplifier and the output terminal of the operational amplifier, and is configured to feedback the first signal to the input terminal of the operational amplifier. The transistor comprises a source terminal, a gate terminal and a drain terminal. The source terminal of the transistor switch is electrically coupled to the output terminal of the operational amplifier. The drain terminal of the transistor switch is electrically coupled to an output pin of the driving circuit. The voltage level conversion circuit is electrically coupled between the source terminal of the transistor switch and the gate terminal of the transistor switch. When the voltage level conversion circuit is enabled, the voltage level conversion circuit is configured to control a voltage difference between the gate terminal and the source terminal of the transistor switch to a set value, so that the transistor switch is turned on, and the first signal is outputted to the output pin of the driving circuit through the transistor switch.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled", there are no intervening elements present. As used herein, the term "and/or" includes an associated listed items or any and all combinations of more.

Figure 1:
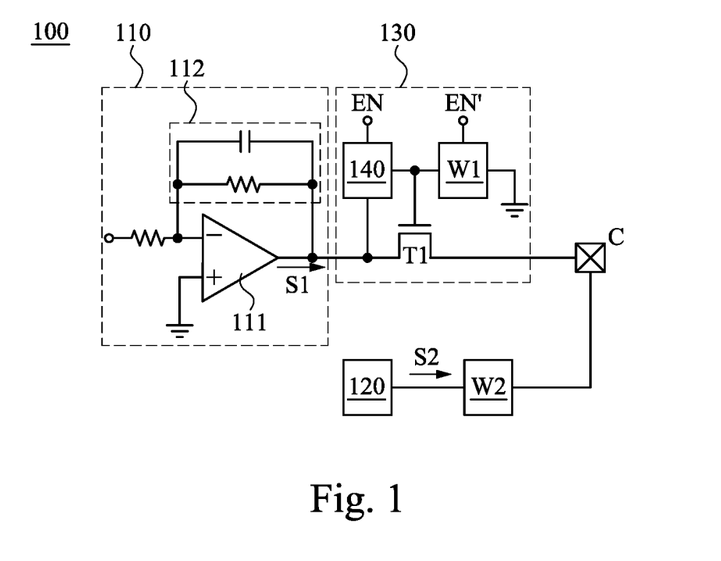
FIG. 1 is a schematic diagram of a driving circuit in some embodiments of the present disclosure.

The present disclosure relates to a driving circuit 100, which is configured to drive any type of load circuit. In some embodiments, the driving circuit 100 is configured to selectively turn on different branch circuits, so as to receive or transmit the corresponding signal. Referring to FIG. 1, the driving circuit 100 includes a first circuit 110 and a switch circuit 130. In some embodiments, the first circuit 110 includes an operational amplifier 111 and a feedback circuit 112. The switch circuit 130 includes a transistor switch T1 and a voltage level conversion circuit 140. An input terminal of the operational amplifier 111 is configured to receive or transmit an input signal, and output a first signal S1 through an output terminal of the operational amplifier 111. The feedback circuit 112 is electrically coupled between the input terminal and the output terminal of the operational amplifier 111, so as to beedback the first signal S1 to the input terminal of the operational amplifier 111. In some embodiments, the feedback circuit 112 includes a capacitor and a resistor that are connected in parallel, and is electrically coupled between the negative input terminal and output terminal of the operational amplifier 111. The positive input terminal of the operational amplifier 111 is electrically coupled to the ground, but the first circuit 110 is not limited thereto.

The transistor switch T1 includes a source terminal, a gate terminal and a drain terminal. The source terminal of the transistor switch T1 is electrically coupled to the output terminal of the operational amplifier 111, so as to receive the first signal S1. The drain terminal of the transistor switch T1 is electrically coupled to an output pin C of the driving circuit 100. In some embodiments, the transistor switch T1 is an N-type Metal-Oxide-Semiconductor Field-Effect Transistor. When a voltage difference between the gate terminal and the source terminal of the transistor switch T1 is positive, the transistor switch T1 is turned on. In some other embodiments, the transistor switch T1 is a P-type Metal-Oxide-Semiconductor Field-Effect Transistor. When the first voltage difference between the gate terminal and the source terminal of the transistor switch T1 is negative, the transistor switch T1 is turned on. In addition, it should be understood that the positions of the source terminal and the drain terminal of the transistor switch T1 are interchangeable without affecting the operation of switch circuit 130.

The voltage level conversion circuit 140 is electrically coupled between the source terminal of the transistor switch T1 and the gate terminal of the transistor switch T1, so as to increase or decrease the received signal (i.e., first signal S1). Accordingly, when the voltage level conversion circuit 140 is enabled by the first control signal EN, the voltage level conversion circuit 140 may control the voltage difference between the gate terminal and the source terminal of the transistor switch T1 to a set value, so that the transistor switch T1 is turned on. At this moment, the first signal S1 is outputted to the output pin C of the driving circuit 100 through the transistor switch T1. In some embodiments, the voltage level conversion circuit 140 may be implemented in or implemented by a level shifter.

Figure 2A:
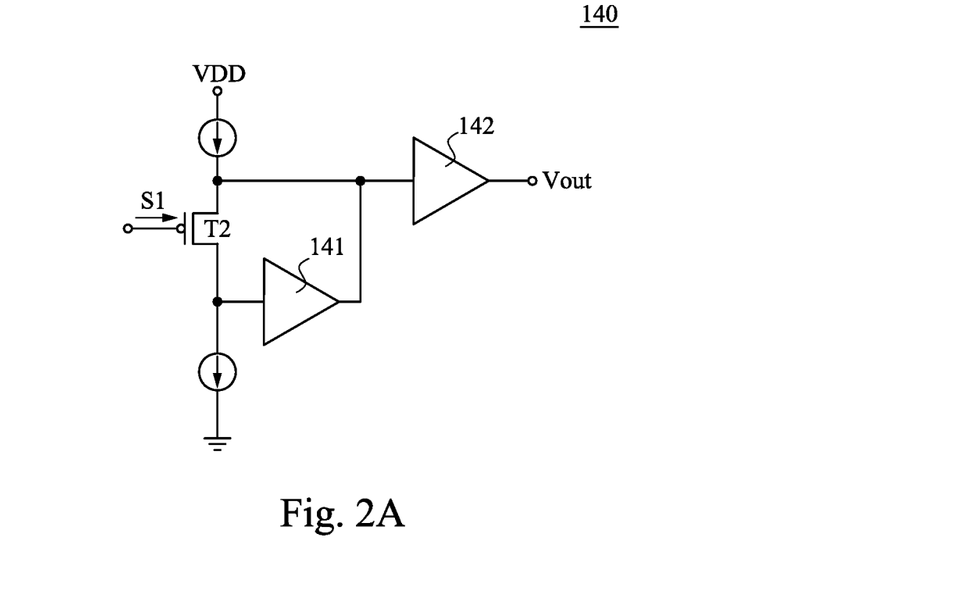
FIGS. 2A and 2B are a schematic diagrams of a voltage level conversion circuit in some embodiments of the present disclosure.

Referring to FIG. 2A, in the case that the transistor switch T1 is an N-type MOSFET, the voltage level conversion circuit 140 includes a source follower which includes a control transistor T2, an inverting amplifier 141, and a buffer 142. The drain terminal and the source terminal of the control transistor T2 are electrically coupled to different current sources, respectively. The control transistor T2 is driven by a power supply VDD. The control terminal (e.g., gate terminal) of the control transistor T2 is electrically coupled to the source terminal of the first transistor switch T1 so as to receive the first signal S1. The source terminal of the control transistor T2 is coupled to the output terminal Vout through the buffer 142, so as to output the adjusted first signal S1 to the gate terminal transistor of the switch T1. An input terminal of the inverting amplifier 141 is electrically coupled to the drain terminal of the control transistor T2, and an output terminal of the inverting amplifier 141 is connected to the source terminal of the control transistor T2 so as to reduce the equivalent impedance of the buffer 142.

Figure 2B:
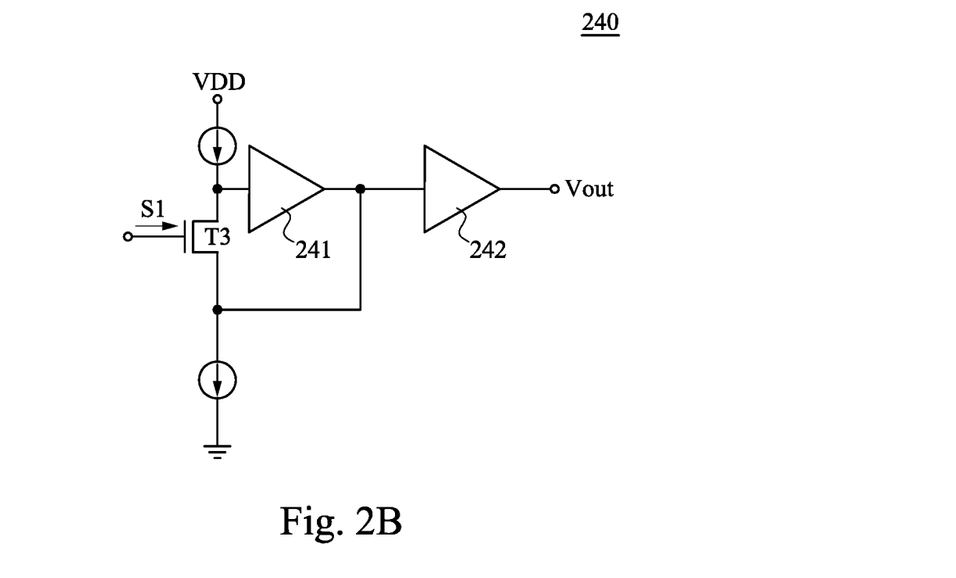

In the case that the transistor switch T1 is a P-type MOSFET, then the voltage level conversion circuit needs to be adjusted accordingly. Referring to FIG. 2B, in some embodiments, the voltage level conversion circuit 240 includes a control transistor T3, an inverting amplifier 241, and a buffer 242. The drain terminal and the source terminal of the control transistor T3 are electrically coupled to the different current sources, respectively. The control terminal of the control transistor T3 is electrically coupled to the source terminal of the first transistor switch T1 so as to receive the first signal S1. The input terminal of the inverting amplifier 241 is electrically coupled to the drain terminal of the control transistor T3. The output terminal of the inverting amplifier 241 is connected to the source terminal of the control transistor T3. The source terminal of the control transistor T3 is coupled to the output terminal Vout through the buffer 242, so as to output the adjusted first signal S1 to the gate terminal of the transistor switch T1. The voltage level conversion circuit 240 is configured to decrease and stabilize the level of first signal S1 and reduce the equivalent impedance value.

Accordingly, since the voltage level conversion circuit 140 (or 240) controls and maintains the voltage difference of the transistor switch T1 to a set value (e.g., the voltage difference is between ground and the enable electrical potential of the first control signal EN), the impedance value of the transistor switch T1 may be kept fixed, so that when the first signal S1 is transmitted to the transistor switch T1, the first signal S1 does not cause distortion problems due to a drastical voltage changes. The voltage level conversion circuit 140 (or 240) may increase the first signal S1 to a pre-determined voltage level. For example, in the case that the transistor switch T1 is an N-type MOSFET, the amplitude of the first signal S1 is in a range of 2 to 4 volts, and the signal amplitude of the output terminal Vout of the voltage level conversion circuit 140 will be the amplitude of S1 plus a fixed voltage X, i.e., (2+X) volts~(4+X) volts, increasing the level of X volts. On the other hand, in the case that the transistor switch T1 is a P-type MOSFET, the signal amplitude of the output terminal Vout of the voltage level conversion circuit 240 will be in a range of (2-X) volts~(4-X) volts, decreasing the level of X volts.

The characteristic formula of the MOSFET is: $R_{on}=1/(\mu C_{ox}(W/L)(V_{gs}-V_{th}))$. According to the foregoing formula, the impedance value Ron of the transistor switch T1 depends on the channel width (W), the channel length (L), and the voltage difference ($V_{g\_s}$) between the gate terminal and the source terminal. Once the driving circuit utilized a transmission-gate switch, the impedance of this switch will vary with input signal owing to the unlimited voltage difference between gate and source. One solution to the aforementioned issue is to increase the MOSFET's channel width to reduce the impedance variation of the impedance value Ron of the switch circuit 130. However, this will occupy too large areas to realize an on-chip switch. In addition, this will increase the parasitic capacitance of the output pin and affect the high-speed digital signal in the same pin. Through the present disclosure, the switch circuit 130 can have a high linearity impedance value when the switch circuit 130 is turned on, and a low parasitic capacitance when the switch circuit 130 is turned off, without increasing the area of the transistor switch T1.

Figure 3:
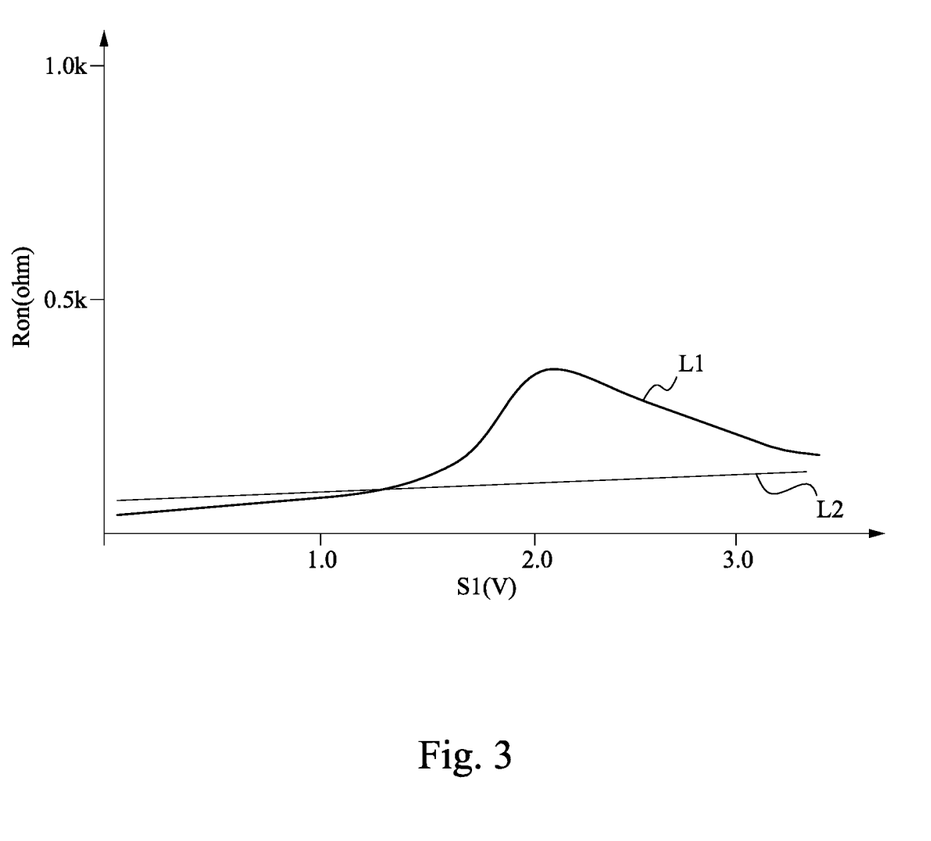
FIG. 3 is a diagram of Impedance characteristic lines of a switch circuit in some embodiments of the present disclosure and the other driving circuit.

Referring to FIG. 3, which is a comparison of resistance characteristics of a transmission gate as a switch circuit and a switch circuit of the present disclosure. In FIG. 3, the horizontal axis represents the voltage value of the first signal S1, and the vertical axis represents the impedance of the switch circuit, e.g., Ron. The characteristic line L1 corresponds to a switch circuit using a transmission gate, and the characteristic line L2 corresponds to the switch circuit 130 of the present disclosure. Since the present disclosure maintains the voltage difference of the transistor switch T1 at a set value through the voltage level conversion circuit 140, the impedance value Ron may be linearly changed to avoid first signal S1 distortion. In some embodiments, as shown in FIG. 1, the first end of the feedback circuit 112 is electrically coupled to the negative input terminal of the operational amplifier 111. The second end of the feedback circuit 112 is directly connected to the output terminal of the operational amplifier 111. Alternatively stated, the switch circuit 130 is located outside the feedback circuit 112, but the disclosure is not limited thereto. In some other embodiments, referring to FIG. 4, the driving circuit 200 similarly includes a first circuit 110 and a switch circuit 130, but the second end of the feedback circuit 112 is connected to the drain terminal of the transistor switch T1. Alternatively stated, the first transistor switch T1 is electrically coupled between the output terminal of the operational amplifier 111 and the second terminal of the feedback circuit 112. The feedback circuit 112 is configured to feedback the first signal S1 adjusted by the switch circuit 130, to the negative input terminal of the operational amplifier 111. Since the closed-loop gain of the feedback circuit 112 can reduce the equivalent impedance value of the transistor switch T1, the transistor switch T1 with a smaller aspect ratio (W/L) can achieve the same circuit function as shown in FIG. 1, through the closed-loop gain of the feedback circuit 112.

Figure 4:
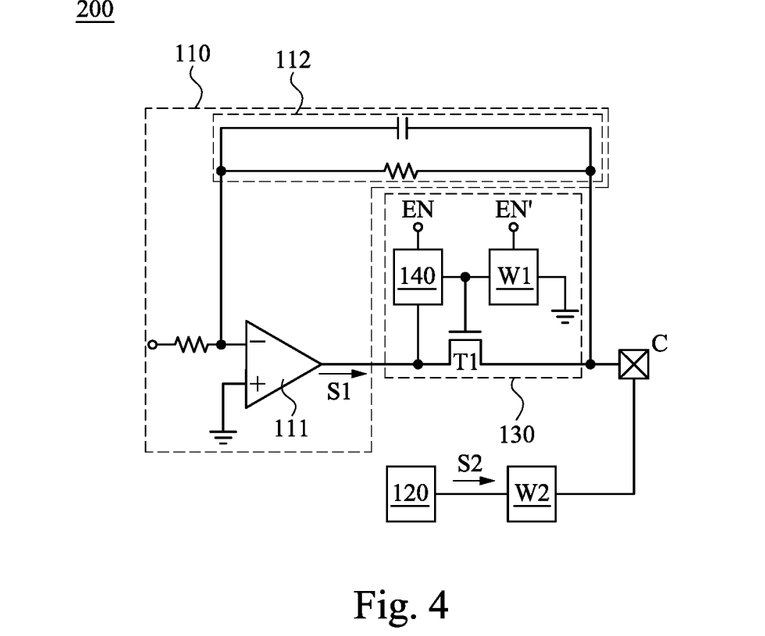
FIG. 4 is a schematic diagram of a driving circuit in some embodiments of the present disclosure.

Referring to FIG. 1 and FIG. 4, in some embodiments, the driving circuit 100 (or 200) further includes a first switch W1. The first switch W1 is electrically coupled between the gate terminal of the transistor switch T1 and a reference electric potential (e.g., ground potential), and is turned on or off according to the first reverse control signal EN'. The first reverse control signal EN' is the inverse of the first control signal EN. When the voltage level conversion circuit 140 is disabled, the first reverse control signal EN' will turn on the first switch W1, so that the gate terminal of the transistor switch T1 is fixed to have the reference electric potential. For example, in the case that the transistor switch T1 is an N-type MOSFET, the reference electric potential is a ground potential or a low electric potential to turn off the transistor switch T1. On the other hand, in the case that the transistor switch T1 is a P-type MOSFET, the first switch W1 will be turned on to pass a high electric potential (e.g., supply voltage VDD) for turning off the transistor switch T1. Accordingly, it will be ensured that when the voltage level conversion circuit 140 is disabled, the transistor switch T1 is turned off by the reference electric potential.

In addition, in some embodiments, the driving circuit 100 (or 200) further includes a second circuit 120. The second circuit 120 is electrically coupled to the output pin C of the driving circuit 100 through the second switch W2. When the voltage level conversion circuit 140 is enabled, the second switch W2 remains turned off. When the voltage level conversion circuit 140 is disabled and the transistor switch T1 is turned off, the second switch W2 will be turned on, so that the second signal S2 outputted by the second circuit 120 can be transmitted through the second switch W2 to the output pin C of the driving circuit 100 (or 200). Those skilled in the art can understand the operation principle of the first switch W1 and the second switch W2, and therefore it will not be further described herein.

In some embodiments, the first circuit 110 includes an analog circuit, and the first signal S1 includes an analog signal. The second circuit 120 includes a digital circuit and the second signal S2 includes a digital signal. In some embodiments, the second signal S2 can be a high-speed digital signal which is, for example, a signal of 480 MHz data rate. The first circuit 110 and the second circuit 120 share an output pin C. Alternatively stated, the driving circuit 100 (or 200) can selectively output the first signal S1 or the second signal S2 through the first circuit 110 or the second circuit 120.

When the first signal S1 outputted by the first circuit 110 is a first analog signal and the switch circuit is a transmission gate, the first (analog) signal S1 changes the impedance value because of the magnitude of the voltage change, and the first (analog) signal S1 will be distorted after passing through the switch circuit. The present disclosure controls the voltage difference between the gate terminal and the source terminal of the transistor switch T1 by utilizing the voltage level conversion circuit 140 (or 240). According to the foregoing characteristic formula, when the voltage difference between the gate terminal and the source terminal is fixed, the impedance variation of the transistor switch T1 is limited. Accordingly, the distortion of the first (analog) signal S1 can be avoided when the switch circuit is turned on, and the parasitic capacitance can be reduced when the switch circuit is turned off. In addition, when the transistor switch T1 is turned off, it can isolate the high voltage at the digital circuit side as an additional protection circuit other than ESD protection circuitry.

Table 1 is an comparison table of "switch circuit for transmission gate (TG)" and "switch circuit for the present disclosure". "Circuit 1" represents the switch circuit outside the feedback circuit (as shown in FIG. 1). "Circuit 2" represents the switch circuit inside the feedback circuit (as shown in FIG. 4). As shown in Table 1, "switch circuit for the present disclosure" is superior to "switch circuit for transmission gate (TG)" in both terms of area (W/L) and parasitic capacitance.

TABLE 1

|  | Circuit 1 for TG | Circuit 2 for TG | Circuit 1 for the present disclosure | | Circuit 2 for the present disclosure | |
| --- | --- | --- | --- | --- | --- | --- |
| W/L of PMOS | 588,000/0.5 μm | 140,000/0.5 μm | N/A | 5,600/0.5 μm | N/A | 5,600/0.5 μm |
| W/L of NMOS | 588,000/0.5 μm | 140,000/0.5 μm | 3,500/0.5 μm | N/A | 3,500/0.5 μm | N/A |

TABLE 1-continued

|  | Circuit 1 for TG | Circuit 2 for TG | Circuit 1 for the present disclosure | | Circuit 2 for the present disclosure | |
| --- | --- | --- | --- | --- | --- | --- |
| Parasitic capacitance | 1.13 nF | 269 pF | 3 pF | 8.34 pF | 4.9 pF | 10.2 pF |
| Total harmonic distortion | −85 dB | −118 dB | −85 dB | −85 dB | −118 dB | −118 dB |

Figure 5:
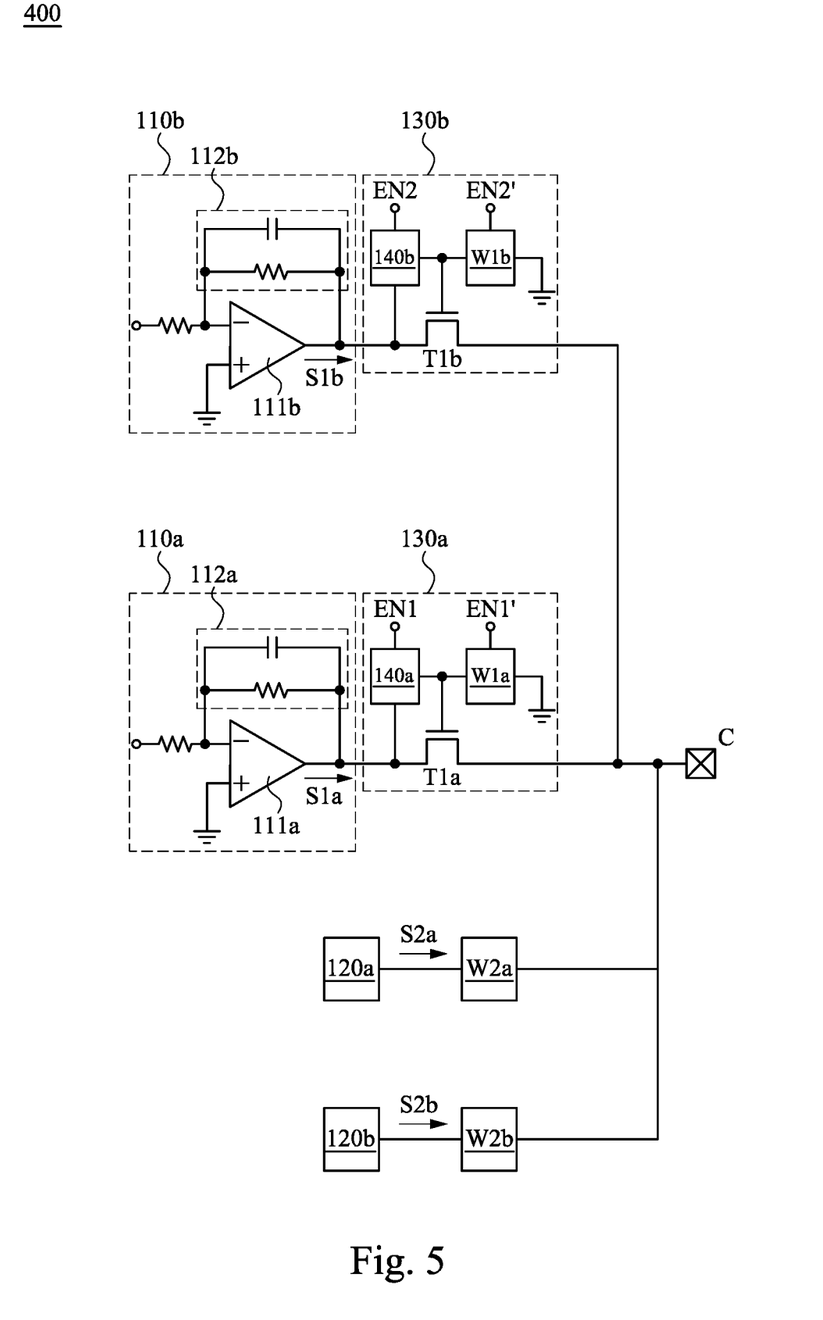
FIG. 5 is a schematic diagram of a driving circuit in some embodiments of the present disclosure.

In some embodiments, the driving circuit 400 of FIG. 5 includes multiple analog circuits and multiple digital circuits. As shown in FIG. 5, the driving circuit 400 includes a first analog circuit 110a, a first switch circuit 130a, a second analog circuit 110b, a second switch circuit 130b, a first digital circuit 120a, and a second digital circuit 120b. The first analog circuit 110a is configured to output the first analog signal S1a. The first switch circuit 130a includes a first transistor switch T1a and a first voltage level conversion circuit 140a. The first transistor switch T1a has a source terminal, a gate terminal, and a drain terminal. The source terminal of the first transistor switch T1a is electrically coupled to the output terminal of the first analog circuit 110a. The drain terminal of the first transistor switch T1a is electrically coupled to the output pin C of the driving circuit 400.

The first voltage level conversion circuit 140a is electrically coupled between the source terminal of the first transistor switch T1a and the gate terminal of the first transistor switch T1a. When the first voltage level conversion circuit 140a is enabled according to the first control signal EN1, the first voltage level conversion circuit 140a is configured to control the voltage difference between the gate terminal and the source terminal of the first transistor switch T1a at a set value, so that the first transistor switch T1a is turned on, and the first analog signal S1a is outputted to the output pin C of the driving circuit 400a through the first transistor switch T1a. On the other hand, when the first voltage level conversion circuit 140a is disabled according to the first control signal EN1, the first analog switch W1a is turned on to pass the reference electric potential (e.g., ground potential) according to the first reverse control signal EN1', so that the first transistor switch T1a will be turned off by the reference electric potential.

In some embodiments, the second analog circuit 110b and the second switch circuit 130b are operated in the same manner as the first analog circuit 110a and the first switch circuit 130a, but the second voltage level conversion circuit 140b is enabled according to the second control signal EN2, and the second analog switch W1b is controlled by the second reverse switch signal EN2'. When the second voltage level conversion circuit 140b is enabled according to the second control signal EN2, the second analog circuit 110b will output the second analog signal S1b to the output pin C.

When the first reverse control signal EN1' and the second reverse control signal EN2' respectively turn on the first analog switch W1a and the second analog switch W1b, so that the first voltage level conversion circuit 140a and the second voltage level conversion circuit 140b are disabled. The first digital switch W2a is turned on according to the first switching signal, so that the first digital signal S2a outputted by the first digital circuit 120a is transmitted to the output pin C of the driving circuit 400. Alternatively, the second digital switch W2b is turned on according to the second switch signal, so that the second digital signal S2b outputted by the second digital circuit 120b can be transmitted to the output pin C. The second analog circuit 110b can be the same as the first analog circuit 110a (for example, the second analog circuit, the second transistor switch, and the second voltage level conversion circuit are included and/or configured in the same manner), and merely the signal content for transmission is different, and therefore it will not be described herein.

Specifically, only one of the first analog circuit 110a, the second analog circuit 110b, the first digital circuit 120a, and the second digital circuit 120b may be enabled at the same time. Therefore, the circuits can share the same output pin C, so that the driving circuit 100 is more compact and facilitates miniaturization of the electronic device.

As described above, in the embodiments shown in FIG. 5, the first analog circuit 110a further includes a first operational amplifier 111a and a first feedback circuit 112a. The output terminal of the first operational amplifier 111a is configured to output the first analog signal S1a. The first feedback circuit 112a is electrically coupled between the input terminal and the output terminal of the first operational amplifier 111a, and configured to feedback the first analog signal S1a to the input terminal of the first operational amplifier 111a. The first operational amplifier 111a and the first feedback circuit 112a are operated in the same manner as the first embodiment shown in FIG. 1, and therefore it will not be described again.

Similarly, the second analog circuit 110b includes a second operational amplifier 111b, a second feedback circuit 112b, and the second switch circuit 130b includes a second voltage level conversion circuit 140b, a second analog switch W1b, and a second transistor switch T1b. The second voltage level conversion circuit 140b is configured to control the voltage difference between the gate terminal and the source terminal of the second transistor switch T1b to another set value. The detailed operations of these components are the same as those in the above embodiments, and will not be further described herein.

Figure 6:
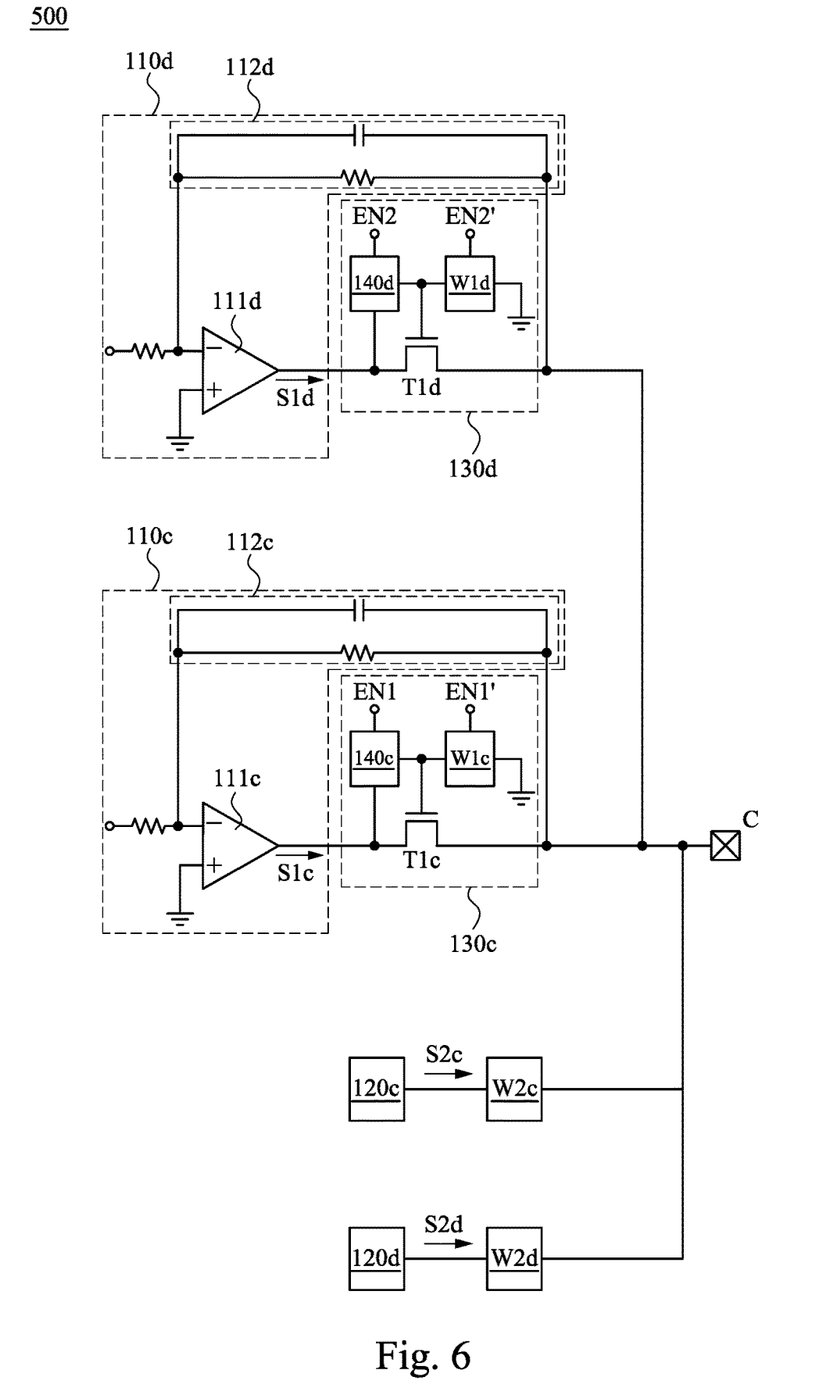
FIG. 6 is a schematic diagram of a driving circuit in some embodiments of the present disclosure.

FIG. 6 is a diagram of a driving circuit 500 according to various embodiments of the present disclosure. In the embodiments, the driving circuit 500 includes a first analog circuit 110c, a first switch circuit 130c, a second analog circuit 110d, a second switch circuit 130d, a first digital circuit 120c and a second digital circuit 120d. The first analog circuit 110c is configured to output first analog signal Sic. The second analog circuit 110d is configured to output a second analog signal Sid. The first digital circuit 120c is configured to output the first digital signal S2c. The second digital circuit 120d is configured to output a second digital signal Std. The driving circuit 500 includes a first operational amplifier 111c, a first feedback circuit 112c, a first voltage level conversion circuit 140c, a first transistor switch T1c, a first analog switch W1c, a second analog switch W1d, a second operational amplifier 111d, a second feedback circuit 112d, a second voltage level conversion circuit 140d and a second transistor switch T1d. Since the components are operated in the same manner as the embodiments shown in FIG. 4, they are not further described herein.

In the embodiments shown in FIG. 6, by the driving circuit 500, the volume of the first transistor switch T1c and the second transistor switch T1d is more compact by utilizing the closed-loop gain of the first feedback circuit 112c and the second feedback circuit 112d. Taking the first analog circuit 110c as an example, the first end of the first feedback circuit 112c is electrically coupled to the input terminal of the first operational amplifier 111c, and the second end of the first feedback circuit 112c is directly connected to the drain terminal of the first transistor switch T1c, so that the first transistor switch T1 is located in a negative feedback path formed by the output terminal of the first operational amplifier 111c and the second end of the first feedback circuit 112c. The embodiments shown in FIG. 6 are similar to the embodiments shown in FIG. 5. The first switch circuit 130c and the second switch circuit 130d enable the internal voltage level conversion circuits 140c and 140d according to the first control signal EN1 and the second control signal EN2, respectively. The first reverse control signal EN1' and the second reverse control signal EN2' are configured to disable the corresponding first voltage level conversion circuit 140c or second voltage level conversion circuit 140d. The first digital switch W2c and the second digital switch W2d are respectively turned on according to a switching signal to pass the digital signal. Only one of the first analog circuit 110c, the second analog circuit 110d, the first digital circuit 120c and the second digital circuit 120d transmits the corresponding signal to the output pin C at the same time.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. A driving circuit, comprising:
a first analog circuit, an output terminal of the first analog circuit configured to output a first analog signal;
a digital circuit configured to output a digital signal;
a first transistor switch comprising a source terminal, a gate terminal, and a drain terminal, wherein the source terminal of the first transistor switch is electrically coupled to the output terminal of the first analog circuit, and the drain terminal of the first transistor switch is electrically coupled to an output pin of the driving circuit; and
a first voltage level conversion circuit electrically coupled between the source terminal of the first transistor switch and the gate terminal of the first transistor switch, wherein when the first voltage level conversion circuit is enabled, the first voltage level conversion circuit is configured to control a voltage difference between the gate terminal and the source terminal of the first transistor switch to a set value, so that the first transistor switch is turned on, and the first analog signal is outputted to the output pin of the driving circuit through the first transistor switch, when the first voltage level conversion circuit is disabled, the first transistor switch is turned off, so that the digital signal is outputted to the output pin of the driving circuit.

2. The driving circuit of claim 1, further comprising:
a first switch electrically coupled between the gate terminal of the first transistor switch and a reference electric potential, wherein when the first voltage level conversion circuit is disabled, the first switch is turned on, so that the gate terminal of the first transistor switch is turned off through the reference electric potential.

3. The driving circuit of claim 1, wherein the first analog circuit further comprises:
a first operational amplifier, an output terminal of the first operational amplifier configured to output the first analog signal; and
a first feedback circuit electrically coupled between an input terminal of the first operational amplifier and the output terminal of the first operational amplifier so as to feedback the first analog signal to the input terminal of the first operational amplifier.

4. The driving circuit of claim 1, wherein the first analog circuit further comprises:
a first operational amplifier, an output terminal of the first operational amplifier configured to output the first analog signal; and
a first feedback circuit, wherein a first terminal of the first feedback circuit is electrically coupled to an input terminal of the first operational amplifier, a second terminal of the first feedback circuit is electrically coupled to the drain terminal of the first transistor switch, so that the first transistor switch is electrically coupled between the output terminal of the first operational amplifier and the second terminal of the first feedback circuit.

5. The driving circuit of claim 1, further comprising:
a second analog circuit, an output terminal of the second analog circuit configured to output a second analog signal;
a second transistor switch comprising a source terminal, a gate terminal and a drain terminal, wherein the source terminal of the second transistor switch is electrically coupled to the output terminal of the second analog circuit, the drain terminal of the second transistor switch is electrically coupled to the output pin of the driving circuit; and
a second voltage level conversion circuit electrically coupled between the source terminal of the second transistor switch and gate terminal of the second transistor switch, wherein when the second voltage level conversion circuit is enabled, the second voltage level conversion circuit is configured to control a voltage difference between the gate terminal and the source terminal of the second transistor switch to another set value, so that the second transistor switch is turned on, and the second analog signal is outputted to the output pin of the driving circuit through the second transistor switch.

6. A driving circuit, comprising:
a first circuit comprising an operational amplifier and a feedback circuit, wherein an output terminal of the operational amplifier is configured to output a first signal; the feedback circuit is electrically coupled between an input terminal of the operational amplifier and the output terminal of the operational amplifier to configured to feedback the first signal to the input terminal of the operational amplifier;
a transistor switch comprising a source terminal, a gate terminal and a drain terminal, wherein the source terminal of the transistor switch is electrically coupled to the output terminal of the operational amplifier, the drain terminal of the transistor switch is electrically coupled to an output pin of the driving circuit; and a voltage level conversion circuit electrically coupled between the source terminal of the transistor switch and the gate terminal of the transistor switch, wherein when the voltage level conversion circuit is enabled, the voltage level conversion circuit is configured to control a voltage difference between the gate terminal and the source terminal of the transistor switch to a set value, so that the transistor switch is turned on, and the first signal is outputted to the output pin of the driving circuit through the transistor switch.

7. The driving circuit of claim 6, wherein a first terminal of the feedback circuit is electrically coupled to the input terminal of the operational amplifier, a second terminal of the feedback circuit is electrically coupled to the drain terminal of the transistor switch, so that the transistor switch is electrically coupled between the output terminal of the operational amplifier and the second terminal of the feedback circuit.

8. The driving circuit of claim 6, further comprising:
a first switch electrically coupled between the gate terminal of the transistor switch and a reference electric potential, wherein when the voltage level conversion circuit is disabled, the first switch is turned on, so that the gate terminal of the transistor switch is turned off through the reference electric potential.

9. The driving circuit of claim 6, further comprising:
a second circuit electrically coupled to the output pin of the driving circuit through a second switch, wherein when the voltage level conversion circuit is disabled, the transistor switch is turned off, and the second circuit outputs a second signal to the output pin of the driving circuit.

10. The driving circuit of claim 9, wherein the first circuit comprises an analog circuit, and the second circuit comprises a digital circuit.

* * * * *